(12) United States Patent
Costantino et al.

(10) Patent No.: US 11,378,447 B2
(45) Date of Patent: Jul. 5, 2022

(54) HIGH SENSITIVITY PHOTODETECTOR WITH HIGH-GAIN TRANSIMPEDANCE AMPLIFIER

(71) Applicant: The Research Foundation for The State University of New York, Syracuse, NY (US)

(72) Inventors: Anthony Costantino, Buffalo, NY (US); Arkadii Perzov, Manlius, NY (US); Arvydas Matiukas, Liverpool, NY (US)

(73) Assignee: The Research Foundation for The State University of New York, Syracuse, NY (US)

( * ) Notice: Subject to any disclaimer, the term of this patent is extended or adjusted under 35 U.S.C. 154(b) by 417 days.

(21) Appl. No.: 16/599,922

(22) Filed: Oct. 11, 2019

(65) Prior Publication Data

US 2020/0116563 A1    Apr. 16, 2020

Related U.S. Application Data

(60) Provisional application No. 62/744,883, filed on Oct. 12, 2018.

(51) Int. Cl.
*G01J 1/46* (2006.01)
*H03F 3/45* (2006.01)
(Continued)

(52) U.S. Cl.
CPC . *G01J 1/46* (2013.01); *G01J 1/00* (2013.01); *G01J 1/44* (2013.01); *H03F 3/45071* (2013.01); *H05K 1/0218* (2013.01); *H05K 1/115* (2013.01); *H05K 1/181* (2013.01); *G01J 2001/446* (2013.01); *H03F 2200/114* (2013.01);
(Continued)

(58) Field of Classification Search
CPC ........ G01J 1/46; G01J 1/00; G01J 1/44; G01J 2001/446; H03F 3/45071; H03F 2200/114; H03F 2200/129; H03F 2200/228; H03F 2203/45526; H03F 2203/45528; H03F 3/087; H03F 3/45475; H05K 1/0218; H05K 1/115; H05K 1/181; H05K 2201/10022; H05K 2201/10151; H05K 1/0216; H05K 2201/10371
See application file for complete search history.

(56) References Cited

U.S. PATENT DOCUMENTS 7,304,536 B1 * 12/2007 Sutardja ................. H03F 1/34
330/99
10,277,180 B2 * 4/2019 Werking ............... G01P 15/125

* cited by examiner

*Primary Examiner* — Seung C Sohn
(74) *Attorney, Agent, or Firm* — Troutman Pepper Hamilton Sanders LLP (Rochester)

(57) ABSTRACT

One aspect of the present technology relates to a device. The device includes a sensor having an anode and a cathode. An operational amplifier (op-amp) having a single-ended output terminal, a non-inverting input, and an inverting input, is operatively coupled to one of the anode or the cathode of the sensor by the inverting input. A feedback resistor having a resistance of at least approximately one giga-ohm (1 GΩ) is operatively coupled between the single-ended output terminal and the inverting input of the op-amp. A grounded field shunt is positioned adjacent to the feedback resistor. The op-amp, grounded field shunt, and feedback resistor are disposed within an electrical shield enclosure. The single-ended output terminal of the op-amp terminates outside of the electrical shield enclosure.

21 Claims, 10 Drawing Sheets

(51) Int. Cl.
*H05K 1/18* (2006.01)
*G01J 1/44* (2006.01)
*H05K 1/11* (2006.01)
*H05K 1/02* (2006.01)
*G01J 1/00* (2006.01)

(52) U.S. Cl.
CPC .. *H03F 2200/129* (2013.01); *H03F 2200/228* (2013.01); *H03F 2203/45526* (2013.01); *H03F 2203/45528* (2013.01); *H05K 2201/10022* (2013.01); *H05K 2201/10151* (2013.01)

HIGH SENSITIVITY PHOTODETECTOR WITH HIGH-GAIN TRANSIMPEDANCE AMPLIFIER

This application claims the benefit of U.S. Provisional Patent Application Ser. No. 62/744,883, filed Oct. 12, 2018, which is hereby incorporated by reference in its entirety.

FIELD

The present technology relates to a high sensitivity sensor. More specifically, the present technology relates to a high sensitivity photodetector with a high-gain transimpedance amplifier.

BACKGROUND

Monitoring electrical activity and $Ca^{2+}$ transients in biological tissues and individual cells increasingly utilizes optical sensors based on voltage-dependent and $Ca^{2+}$ dependent fluorescent dyes. However, achieving satisfactory signal-to-noise ratios (SNR) often requires increased illumination intensities and/or dye concentrations, which results in photo-toxicity, photobleaching, and other adverse effects limiting the utility of optical recordings. Most challenging are the recordings from individual cardiac myocytes and neurons.

Current transimpedance amplifiers used to amplify fluorescent signals from individual cells are insufficiently sensitive, while other types of single-channel photodetectors are prohibitively expensive. High-gain transimpedance amplifiers rely on a high-impedance (>1 GΩ) resistive element in the feedback path to achieve high gain. The key issues that diminish their performance in photo detection are parasitic capacitance, which makes it difficult to achieve the same bandwidth from one circuit to another, cross-talk and capacitive coupling (high-impedance circuits are by nature very susceptible to coupling from or to neighboring circuits), and the difficulty in optimizing the circuit elements to minimize noise (every noise source in the circuit will have a weighted contribution, and therefore none can be neglected). Thus, there is a need for an low-cost, high-sensitivity photodetector incorporating a high-gain transimpedance amplifier.

The present technology is directed to overcoming these and other deficiencies in the art.

SUMMARY

One aspect of the present technology relates to a device. The device includes a sensor having an anode and a cathode. An operational amplifier (op-amp) having a single-ended output terminal, a non-inverting input, and an inverting input, is operatively coupled to one of the anode or the cathode of the sensor by the inverting input. A feedback resistor having a resistance of at least approximately one giga-ohm (1 GΩ) is operatively coupled between the single-ended output terminal and the inverting input of the op-amp. A grounded field shunt is positioned adjacent to the feedback resistor. The op-amp, grounded field shunt, and feedback resistor are disposed within an electrical shield enclosure. The single-ended output terminal of the op-amp terminates outside of the electrical shield enclosure.

Another aspect of the present technology relates to a method of measuring a feature of a signal using the device. The signal to be measured is received by the sensor. An amplified signal based on the received signal is output at the single-ended output terminal of the op-amp. At least one feature of the signal is measured based on the amplified signal.

The high sensitivity photodetector with high-gain transimpedance amplifier of the present technology comprises a circuit topology for a simple, inexpensive, but highly sensitive photodetector with a high-gain transimpedance amplifier that can be used to detect and amplify faint optical signals such as the fluorescent signal emitted by voltage-sensitive fluorescent dyes in cardiac cells. The topology is a novel combination of existing circuit elements and shielding which enables the very low current generated by photons hitting the photodetector to be amplified and converted to a useable voltage that can be provided as an input for various measurements.

DETAILED DESCRIPTION

The present technology relates to a high sensitivity sensor. More specifically, the present technology relates to a high sensitivity photodetector with a high-gain transimpedance amplifier.

One aspect of the present technology relates to a device. The device includes a sensor having an anode and a cathode. An operational amplifier (op-amp) having a single-ended output terminal, a non-inverting input, and an inverting input, is operatively coupled to one of the anode or the cathode of the sensor by the inverting input. A feedback resistor having a resistance of at least approximately one gigaohm (1 GΩ) is operatively coupled between the single-ended output terminal and the inverting input of the op-amp. A grounded field shunt is positioned adjacent to the feedback resistor. The op-amp, grounded field shunt, and feedback resistor are disposed within an electrical shield enclosure. The single-ended output terminal of the op-amp terminates outside of the electrical shield enclosure.

Figure 1:
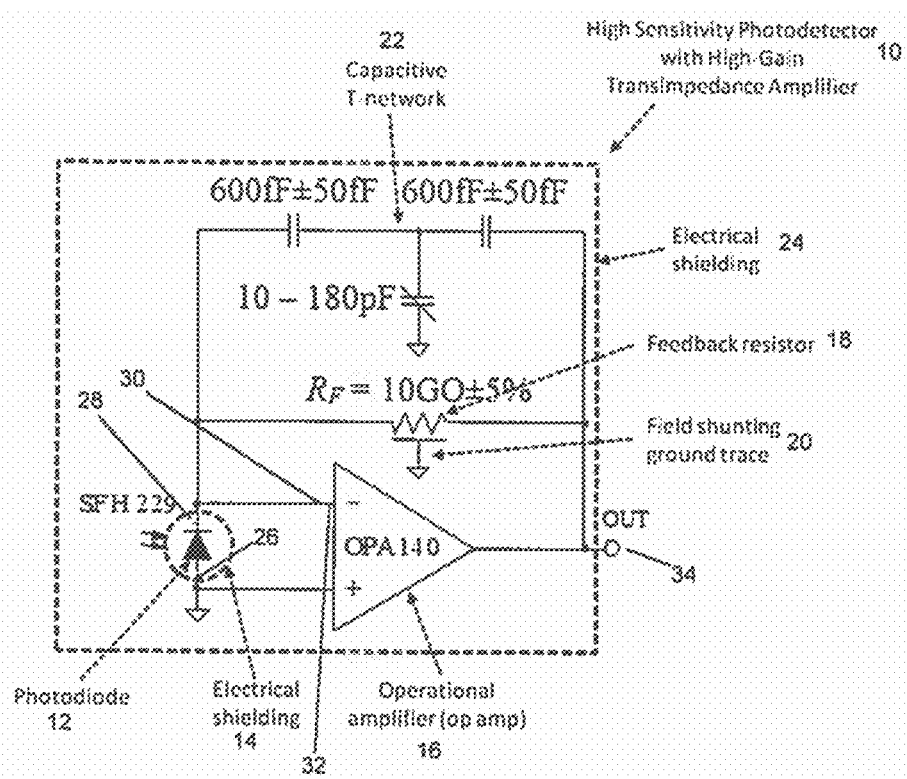
FIG. 1 is a schematic view of one embodiment of a circuit layout of a photodetector of the present technology.

FIG. 1 is a schematic view of a circuit layout of one embodiment of device 10 of the present technology. In this embodiment, device 10 is a photodetector, although in other embodiments, device 10 may be, by way of example only, a device for detecting and amplifying non-optical signals such as sound, pressure or humidity. Device 10 includes sensor 12, first electrical shield enclosure 14, operational amplifier (op-amp) 16, feedback resistor 18, grounded field shunt 20, optional capacitive T-network 22, and second electrical shield enclosure 24, although device 10 may include other types and/or number of elements or components in other configurations. An advantage of the detectors described here are their improved signal-to-noise ratio (SNR), which is particularly useful when detecting faint signals such as fluorescence in cells. The prototype amplifier shown in FIGS. 1 and 2 allows the detection of photocurrents as low as 1 pA peak (500 fA RMS for an action potential). The SNR of the recordings is 10-20 times higher (depending on the application) than the SNR achievable with conventional 100 MΩ gain TIAs.

Referring to FIG. 1, device 10 includes sensor 12, which in this embodiment is a PIN photodiode, such as an SFH 229 PIN photodiode, for example. In other embodiment, sensor 12 can be any type of high-impedance sensor. For example, sensor 12 may be any self-generating sensor that yields an electric signal from a measurand (quantity being sensed) without requiring any electric supply. Self-generating sensors offer alternative methods for measuring many common quantities in particular, temperature, force, pressure, and acceleration. These include, in addition to photodiodes operating in photovoltaic mode, thermoelectric, piezoelectric, pyroelectric, and electrochemical sensors.

By way of example only, sensor 12 can be a MEMS (microelectromechanical system) microphone for measuring sound, a pressure transducer for measuring pressure, or a humidity sensor for measuring humidity. Preferably, sensor 12 has a low capacitance and does not require a high-frequency input for operation. Sensor 12 is electrically coupled to the differential input of op-amp 16 to provide electrical signals from the sensor 12 to op-amp 16 for amplification. Sensor 12 includes an anode 26 and cathode 28, which are coupled to op-amp 16 as described below.

In various embodiments, the sensor 12, such as a PIN photodiode, has a shunt resistance ($r_{sh}$) that is greater than or equal to about 1, 3, 5, 10, 20, 30, 50, 75, 100, 150, 200, or 250 GΩ, and operates in a photovoltaic mode. In one particular embodiment, sensor 12 has a shunt resistance estimated to be about 35.5 GΩ. For a given low-pass cut-off frequency $f_L$ and photocurrent $i_p$, the maximum signal to noise ratio (SNR) for device 10, such as a photodector, of the present technology are achieved using sensor 12, such as a PIN photodiode, with high shunt resistance ($r_{sh}$) and op-amp 16 with low current and voltage noise, as described in further detail below.

In this embodiment, sensor 12 is located, at least partially, within first electrical shield 14, although in other embodiments sensor 12 does not have a separate electrical shield. First electric shield 14 is a roughly continuous layer of electrically conductive material. First electric shield 14 electrically shields sensor 12 from op-amp 16, feedback resistor 18, and optional capacitive T-network 20. In various embodiments, first electrical shield 24 is composed of a conductive metal, such as, but not limited to, copper. The first electrical shield 14 should be sufficient to prevent most (at least about 75%, 90%, 95%, 98%, 99%, 99.9% or 99.99%) or all parasitic capacitance, capacitive coupling, and crosstalk between sensor 12 and the other elements of device 10, as well as other adjacent circuits and devices. In an embodiment, first electrical shield 14 is connected to the ground plane as described in further detail below. In one embodiment, light is delivered to sensor 12, which is a PIN photodiode, via an optical fiber that collects the light to be measured. In this embodiment, the optical fiber passes through an opening in first electrical shield 14 to provide the light to be measured to sensor 12. In various embodiments, the first electrical shield 14 has an opening permitting light, or other measurand, to pass through to sensor 12, such as to a photosensitive surface of a photodiode.

In this embodiment, op-amp 16 is an OPA 140 op-amp. Op-amp 16 includes inverting input 30, non-inverting input 32, and single ended output terminal 34. Inverting input 30 of op-amp 16 can be connected to either anode 26 or cathode 28 of sensor 12. When anode 26 is connected to inverting input 30, non-inverting input 34 and cathode 28 are connected to ground in order to bias sensor 12, which in one embodiment is a PIN photodiode, into photovoltaic mode. When cathode 28 is connected to inverting input 30, non-inverting input 34 and anode 26 are connected to ground in order to bias sensor 12 into photovoltaic mode. In various embodiments, the current noise of op-amp 16 is less than or equal to about 2, 1.5, 1, 0.8, or 0.5 fA/√Hz, and the voltage noise of op-amp 16 is less than or equal to about 30, 20, 15, 10, 8, 7, 6, 5.5, or 5 nV/√Hz. In an embodiment, output terminal 34 of op-amp 16 is connected to a filter.

Feedback resistor 18 is connected in parallel to op-amp 16 (between inverting input 30 and output terminal 34 of op-amp 16). Feedback resistor 18 provides a very high resistance. In one embodiment, feedback resistor 18 provides a resistance greater than about 1 GΩ. In other embodiments, feedback resistor 18 has a resistance $R_F$ greater than or equal to about 2, 3, 4, 5, 6, 7, 8, 9, 10, 15, 20, 25, 30, 40, 50, 60, 75, or 100 GΩ. In one particular embodiment, feedback resistor 18 is a 10 GΩ±5% feedback resistor in a 1206 package.

Grounded field shunt 20 is coupled to feedback resistor 18. Grounded field shunt 20 is positioned adjacent to feedback resistor 18, in a position slightly offset toward the output end of feedback resistor 18. Positioning the field shunt 20 closer to the output end of the feedback resistor 18 shifts any additional stray capacitance to output terminal 34 rather than inverting input 30

Optional capacitive T-network 22 is connected in parallel to op-amp 16 (between inverting input 30 and output terminal 34 of op-amp 16). Optional capacitive T-network 22 is also connected in parallel with feedback resistor 18 to enable bandwidth tuning. Optional capacitive T-network 22 enables bandwidth tuning and helps ensure that device 10 has the desired properties, as described in further detail below. In an embodiment, capacitive T-network 22 produces a capacitance from 1 fF to 50 fF. The values of $C_X$ were chosen at 600 fF and the trimmer cap has a range 10 p-180 pF to add 2-32 fF of capacitance for tuning the device's bandwidth, as described in further detail below.

Figure 2:
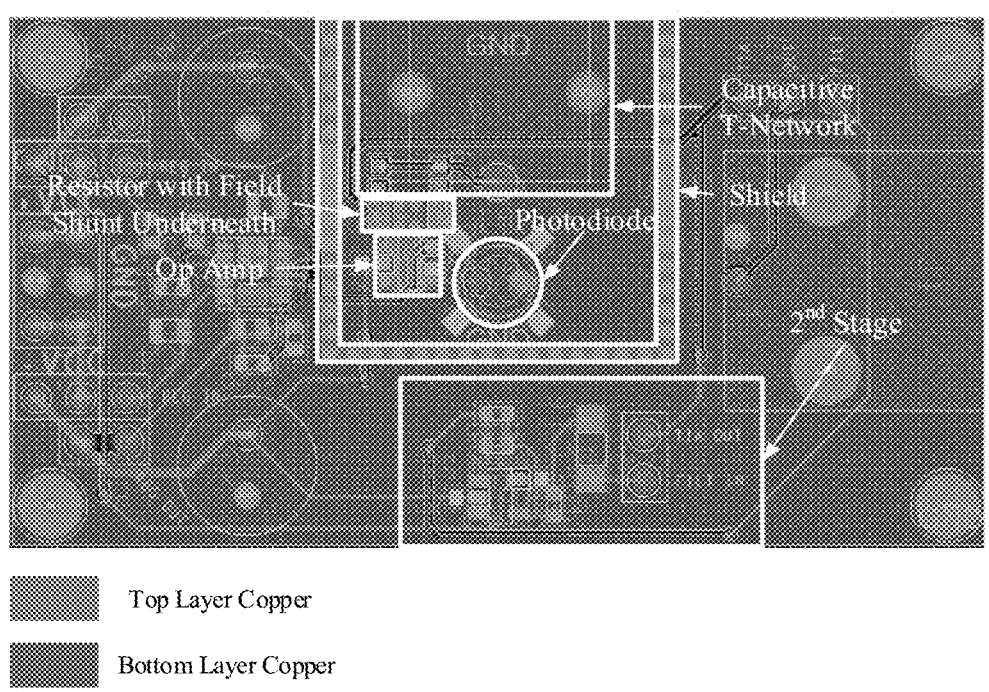
FIG. 2 is a schematic view of one embodiment of the circuit layout of present technology disposed on a printed circuit board with schematic symbols imposed over the package footprints.

Sensor 12, op-amp 16, feedback resistor 18, grounded field shunt 20, and optional capacitive T-network 22 are located within second electrical shield enclosure 24, such that each element is electrically shielded from any adjacent circuits and devices, including any second state signal conditioning circuits, such as second stage circuit 36 as shown in FIG. 2.

Referring again to FIG. 1, second electrical shield enclosure 24 may be configured as any roughly continuous layer of electrically conductive material. In embodiments, second electrical shield 24 encloses, at least partially, the circuit elements of device 10 to be shielded. Second electrical shield 24 may be an enclosure, such as a grid, case, or box, composed of a conductive material. In embodiments, second electrical shield 24 is composed of a conductive metal, such as, but not limited to, copper. Second electrical shield 24 should be sufficient to prevent most (at least about 75%, 90%, 95%, 98%, 99%, 99.9% or 99.99%) or all parasitic capacitance, capacitive coupling, and crosstalk between the circuit elements of device 10 located with second electrical shield 24 and adjacent circuits and devices.

Second electrical shield enclosure 24 is configured such that output terminal 34 of op-amp 16 terminates beyond second electrical shield enclosure 24. In one embodiment, second electrical shield 24 is connected to ground as described in further detail below. The connection of second electrical shield 24 to ground allows all or most of the stray capacitance to go from the circuit elements of device 10 to ground instead of from one circuit element to another circuit element. In an embodiment, second electrical shield 24 serves as a field shunt for feedback resistor 18 and there is no separate grounded field shunt 20. Although second electrical shield enclosure 24 is described, it is to be understood that in other embodiments, each of the elements in device 10 may be separate shielded from one another.

Referring now to FIG. 2, in one embodiment, the elements of device 10 including sensor 12, op-amp 16, feedback resistor 18, and optional capacitive T-network 22. In this embodiment, sensor 12 is disposed on a bottom side of a printed circuit board 38 having a ground plane layer. Cathode 28 of sensor 12 is connected to inverting input 30 of op-amp 16 as shown in FIG. 1. In this embodiment, op-amp 16, feedback resistor 18, and optional capacitive T-network 22 are disposed on the top surface of insulating layer of printed circuit board 38 opposite sensor 12. In another embodiment, sensor 12 is located on the same side of printed circuit board 38 as the op-amp 16, feedback resistor 18, and option capacitive T-network 22. The ground plane functions as part of the electrical shielding of the circuit elements of device 10. First electrical shield 14, second electrical shield 24, and ground field shunt 20 are connected to the ground plane by vias. Single-ended output terminal 34 of op-amp 16 passes between the vias connecting second electrical shield 24 to the ground plane to extend beyond second electrical shield 24.

FIG. 2 shows the layout of printed circuit board 38 with schematic symbols imposed over the package footprints. Ground field shunt 20 is made from a top layer copper of printed circuit board 38 and is connected to the ground plane with four vias. In this embodiment, ground field shunt 20 is placed directly under feedback resistor 18 slightly closer to output terminal 34 of the op-amp 16, as shown in FIG. 1, so that any additional stray capacitance will be shifted to output terminal 34 rather than inverting input 30. A layer of copper forms a ground plane which is attached to second electrical shield 24 by vias. The circuit is very high impedance and if it is operated without second electrical shield 24, op-amp 16 may oscillate, and there may be crosstalk and coupling with adjacent circuits, such as those in $2^{nd}$ Stage 36. Sensor 12 is separately electrically shielded by first electrical shield 14 and connected to the ground plane by one or more vias.

With a sufficiently high RF, such as an RF of about 10 giga-ohms, the SNR of device shown in FIGS. 1 and 2 can be as high as 36 at 1 pA and 3.9 at 100 fA. In various embodiments, device 10, which provides a high-sensitivity sensor with a high-gain transimpedance amplifier, has an SNR of greater than or equal to about 5, 7.5, 10, 15, 20, 25, 30 or 35 when the output current of the sensor is about 1 pA, and an SNR of greater than or equal to about 0.5, 0.75, 1.0, 1.5, 2.0, 2.5, 3.0, or 3.5 when the output current of the sensor is about 1 fA.

Device 10 of the present technology may be utilized to detect and amplify various parameters in operation, such as temperature, force, pressure, and acceleration, by way of example. In one particular embodiment, device 10 is a photodetector configured to detect and amplify optical signals. By way of example only, device 10 may be employed to detect and amplify faint optical signals, such as the fluorescent signal emitted by voltage-sensitive fluorescent dyes in cardiac cells.

Using a realistic ionic model of cardiac action potential and Ca2+ transients, for the majority of applications of optical mapping, the bandwidth can be reduced to as low as 250-300 Hz and often to 100 Hz. Eliminating excess bandwidth lowers the noise level and allows further increase of the gain of the TIA of device 10, thereby boosting the sensitivity of fluorescence recordings. In embodiments, the preceding SNRs of device 10 are achieved when the circuit has a bandwidth of about 50 Hz, 100 Hz, or about 200 Hz, or about 300 Hz.

Example—Device Design

Figure 3:
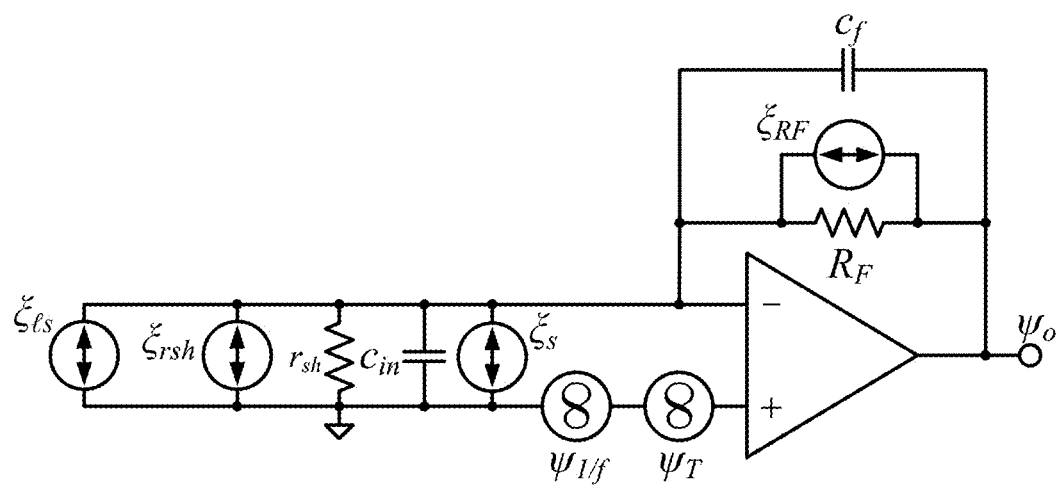
FIG. 3 illustrates a schematic of the noise model that was used to design the photodetector of the present technology.

FIG. 3 shows the schematic of the noise model that was used to design device 10, which in this case is a photodetector using a photodiode as the sensor. Each noise source was modeled as a separate input and is modified by a different transfer function on its way to output terminal of the op-amp. The op-amp was modeled as having infinite gain and infinite input resistance, but still having common-mode and differential-mode input capacitance, which make up part of input capacitance $c_{in}$. The photodiode was modeled as operating in photovoltaic mode (leakage current shot noise was assumed to be negligible) with a shunt resistance $r_{sh}$ and junction capacitance $c_j$, the latter of which was combined with input capacitance of the op-amp to make $c_{in}$. Here $\xi_{RF}$ is the thermal noise density of the feedback resistor, $\xi_{rsh}$ is the thermal noise density (contributed by $r_{sh}$) of the photodiode, $\xi_{Is}$ is the photocurrent shot noise density, and $\xi_s$ is the current noise density of the op-amp. The noise model for the op-amp also contained two voltage noise sources: the thermal noise $\psi_T$ and the flicker noise $\psi_{1/f}$.

Using the model, an expression for signal to noise ration (SNR) was created:

$$SNR = \frac{R_F \xi_p}{\sqrt{\alpha f_L R_F^2 + \beta f_L R_F}} \quad (1)$$

where $$\alpha = \xi_s^2 + 4kT/r_{sh} + 2q\bar{i_p} + (2\pi c_{in})^2 f_L \gamma \quad (2)$$

Here $\xi_s$ is the current noise density of the op-amp, $r_{sh}$ is shunt resistance of the photodiode, k is Boltzmann's constant, T is the ambient temperature, q is the fundamental charge, $c_{in}$ is the input capacitance, and $\bar{I}_p$ is the average photocurrent. The parameter in the last term being the following function of the thermal noise density of the op-amp and the flicker noise numerator.

$$\gamma = \psi_T^2\left(\frac{\pi}{2}-1\right)f_L + FNN^2 \ln\left(\frac{\pi^2}{4}+1\right) \quad (3)$$

and $$\beta = 4kT \quad (4)$$

The analysis of the SNR equation shows that as approaches infinity the SNR reaches its asymptotic value:

$$SNR_\infty = \lim_{R_f \to \infty} SNR = \frac{\xi_p}{\sqrt{\alpha f_L}} \quad (5)$$

While $SNR_\infty$ represents the theoretical ceiling, a "practical target for feedback resistance $R_F$ can be $R_{F,90}$, the feedback resistance corresponding to 90% of $SNR_\infty$. Increasing $R_F$ beyond $R_{F,90}$ would no longer result in significant improvement of SNR.

The value of $R_{F,90}$ can be approximated using the following simple formula:

$$R_{F,90} = 4.26 \frac{\beta}{\alpha} \quad (6)$$

Figure 4:
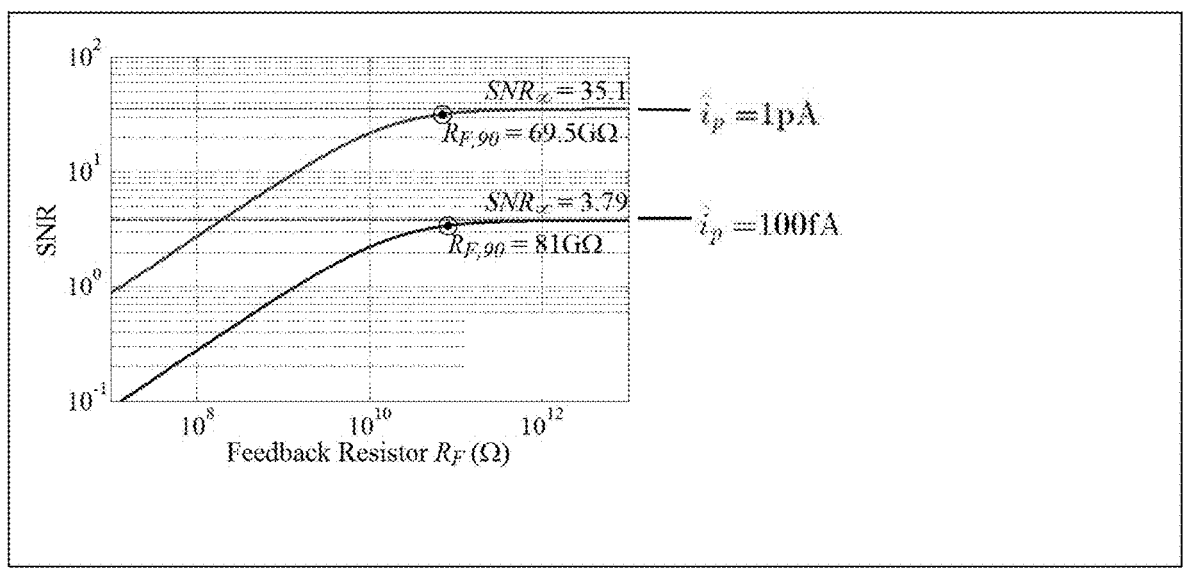
FIG. 4 is a plot of signal to noise ratio (SNR) vs feedback resistance (RF) for 100 fA and 1 pA peak photocurrent. The maximum value of the SNR is indicated with a dashed line. Black dots and empty circles show the points where the SNR has reached 90% of the maximum. The op-amp parameters were taken from the OPA140 datasheet and the photodiode parameters are $r_{sh}$=b100 GΩ and $c_j$=13 pF.

For the examples shown in FIG. 4, $R_{F,90}$ is as high as 71.7 GΩ and 84 GΩ for 1 pA and 0.1 pA, respectively. These values are almost three orders of magnitude larger than those currently used in PD-TIA photodiode amplifiers.

Example 2—Circuit Element Optimization

Equation (5) is not only useful for assessing the practical limit for increasing $R_F$, it can also be used for the selection of optimal circuit elements. For example by looking at the expression for given by equation (2) one can immediately see the rationale for using photodiodes with the highest shunt resistance ($r_{sh}$). However, as shown below, equation (5) becomes particularly handy for the optimal selection of the op-amp, which as will be shown is more complicated than choosing the op-amp with the lowest $\xi_s$, $\psi_T$, and $\psi_{1/f}$.

The analysis of equations (3) and (5) suggests that at small $c_{in}$ ($c_{in}<1$ pF) the contribution of the voltage noise is relatively small and can be ignored. $c_j$ of the photodiode is the major contributor to, which is generally small for small photodetectors. For this range the best op-amp for the photodetector of the present technology should be an electrometer amplifier, which are known for their lowest current noise density, $\xi_s\sim0.1$ fA/√Hz.

Figure 5:
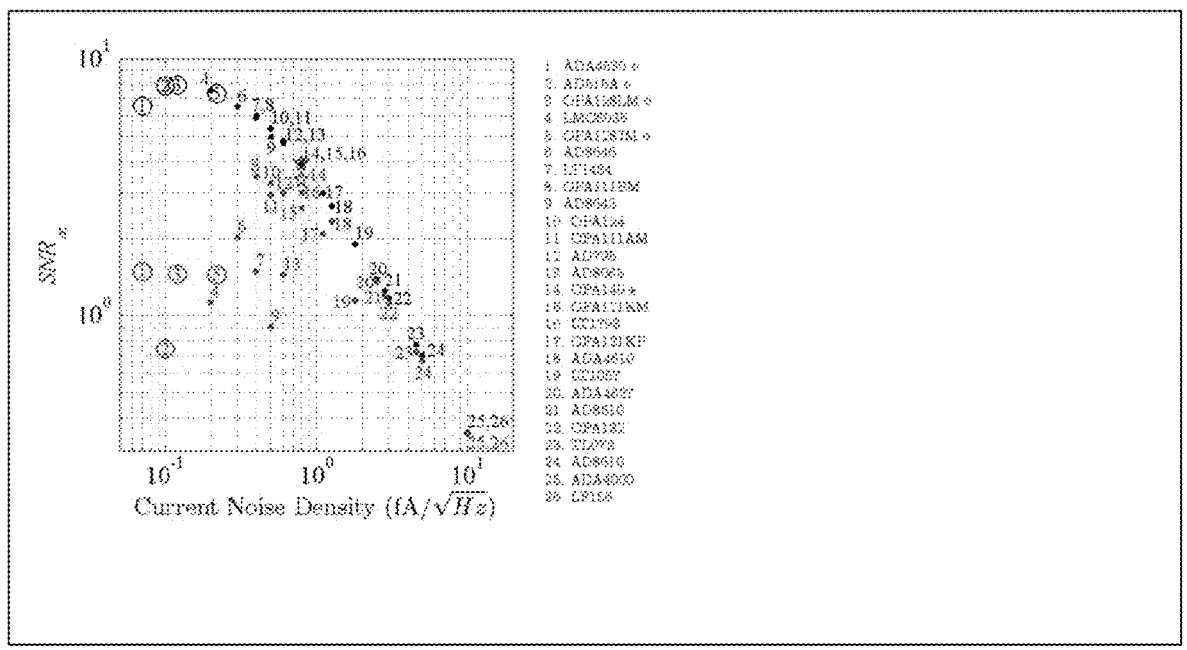
FIG. 5 is a graph illustrating an estimated performance of 26 op-amps with the lowest current noise density when used with photodiodes with low and high junctional capacitance. Black and red symbols indicate $SNR_\infty$ of a given op-amp when used with photodiodes with zero and 100 pF junctional capacitance, respectively. The smaller numbers indicate op-amps with the lower current noise density. The photodiode shunt resistance is 100 GΩ and the bandwidth was 300 Hz.

However, this is not the case when such op-amps are used with photodiodes having moderate to large surface area and correspondingly large input junctional capacitance $c_j$. Electrometer amplifiers usually have higher thermal and flicker noise voltages. This becomes a problem at small $c_f$ and large $c_{in}$ when the already high flicker and thermal noise voltages are amplified by the noise-gain-peaking mechanism to become significant. FIG. 5 shows $SNR_{28}$ for 26 op-amps with low $\xi_s$. Notice that many of the electrometer type op-amps (open circles) manifest significantly reduced performance when used with photodiodes with higher junction capacitance (reduced performance when used with photodiodes with higher junction capacitance (red symbols).

The analysis shows, however, that unlike electrometer op-amps, op-amps #8, 10-12, and 14-18, are much less sensitive to photodiode capacitance. Accordingly, most of the op-amps selected for testing were from this group. These include the OPA140 (#14, star). Other op-amps that have been tested were the LMC6035 (#4) and the AD8641/AD8643 (#9), which have lower current noise than the OPA140 even though they experience a significant decrease in $SNR_\infty$ with large $c_j$, they still have good performance with small photodiodes.

Current noise for specific op-amps is often specified in the data sheets provided by their manufacturer. Voltage noise is generally dominated by thermal noise ($\psi_T$) and flicker noise numerator (FNN), which are often specified in op-amp data sheets, and for the purposes of the present technology, the contribution of $\psi_T$ and FNN to voltage noise can be roughly estimated by the equation $\sqrt{[\psi_T^2+FNN^2/f_L]}$. The contribution of voltage noise is $(2*pi*cin)^2*gamma*fL$, and gamma can be estimated as $\psi_T^2*fL=FNN^2$.

Since the input capacitance $c_{in}$ from the PIN photodiode amplifies the op-amp's voltage noise (by $c_{in}^2$), the levels of $\psi_T$ and/or FNN can be somewhat higher if $c_{in}$ is low. In large photodiodes, the main contributor to $c_{in}$ is the photodiode's junctional capacitance $c_j$, which increases with the surface area of the photodiode. Smaller PIN photodiodes will generally have a smaller $c_j$ and will therefore tend to generate a lower $c_{in}$.

Example 3—Performance Limits

In darkness, the shot noise term is removed from α and the equation is reduced to $$\alpha_d = \xi_s^2 + 4kT/r_{sh} + (2\pi c_{in})^2 f_L \gamma$$

Input referred noise in the absence of illumination is defined as $$i_{nd} = \frac{v_{nd}}{R_F} = \frac{\sqrt{\alpha_d f_L R_F^2 + \beta f_L R_F}}{R_F} \quad (7)$$

The absolute minimum value that $R_F$ can be is found by taking the limit of equation (7) as $\alpha_d$ goes to zero.

$$\lim_{\alpha_d \to 0} i_{nd} = \sqrt{\frac{\beta f_L}{R_F}} \quad (8)$$

Rearranging the above expression to solve for $R_F$ yields the minimum acceptable value of $R_F$ $$\bar{R}_F = \frac{\beta f_L}{\bar{i}_{nd}^2} \quad (9)$$

For this equation, a bandwidth and maximum acceptable level of input referred noise are chosen to determine $\overline{RF}$. In this example, $f_L$=300 Hz and $\overline{i_{nd}}$=50 fArms were chosen, which makes $\overline{RF}$=1.95 GΩ.

This provides the requirement that:

$R_F \geq 1.95$ GΩ, if $f_L$=300 Hz and $i_{nd} \leq 50$ fArms

The range of $\alpha_d$ that will meet the specification of $i_{nd} \leq 50$ fArms is determined by finding the lower limit of equation (7), where $R_F$ goes to zero.

$$\overline{i_{nd}} = \lim_{R_F \to 0} i_{nd} = \sqrt{\alpha_d f_L} \quad (10)$$

If $i_{nd} = \overline{i_{nd}}$ the maximum value of $\alpha_d$ can be determined:

$$\overline{\alpha_d} = \frac{\overline{i_{nd}}}{f_L}$$

Figure 6:
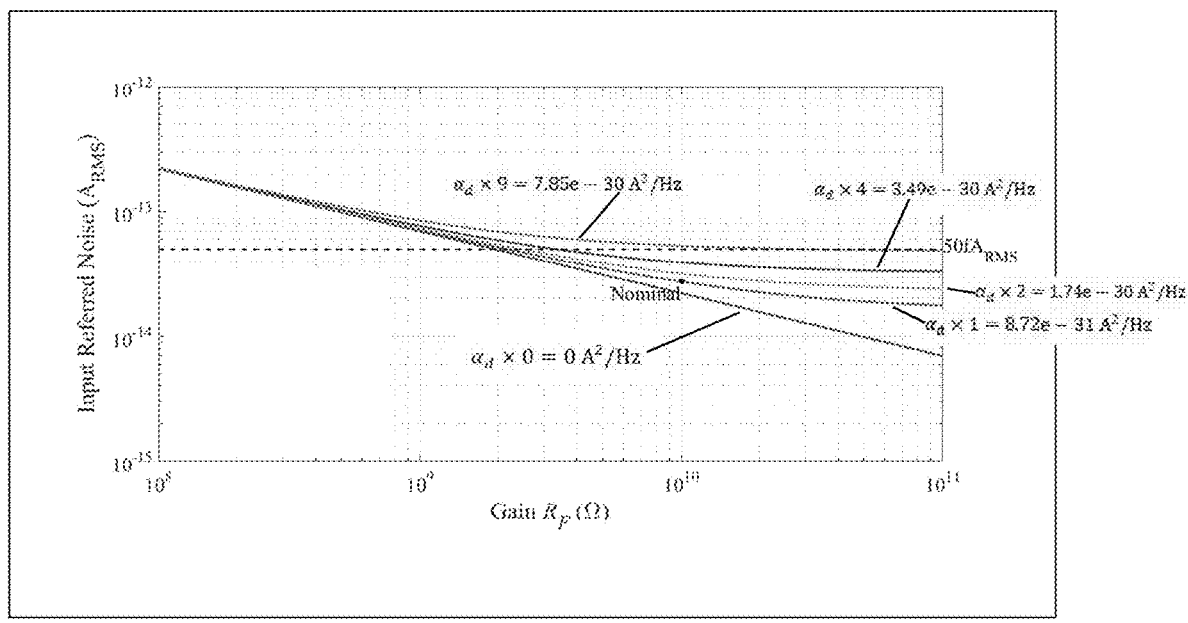
FIG. 6 is a graph illustrating gain vs input referred noise for different values of α. Any combination of $R_F$ and $α_d$ that is below the dashed line will meet the desired performance cutoff of 50 $fA_{RMS}$ of input referred noise. The black dot labeled "Nominal" indicates the value of α, $R_F$, and $i_n$ used in one embodiment of the present technology.

Plugging in the values for $\overline{i_{nd}}$ and $f_L$, yields $\overline{\alpha_d}$=8.33×10⁻³⁰ A²/Hz, or roughly 9.6 times the value of $\alpha_d$ for the amplifier. Therefore the amplifier and photodiode parameters must be chosen such that:

$\alpha_d \leq 8.33 \times 10^{-30}$ A²/Hz, for $i_{nd} \leq 50$ fArms and $f_L$=300 Hz Equation (7) is plotted for discrete values $\alpha_d$ of while sweeping $R_F$. The results are shown in FIG. 6. This illustrates the combinations of $\alpha_d$ and $R_F$ that will produce noise less than 50 fArms.

Figure 7:
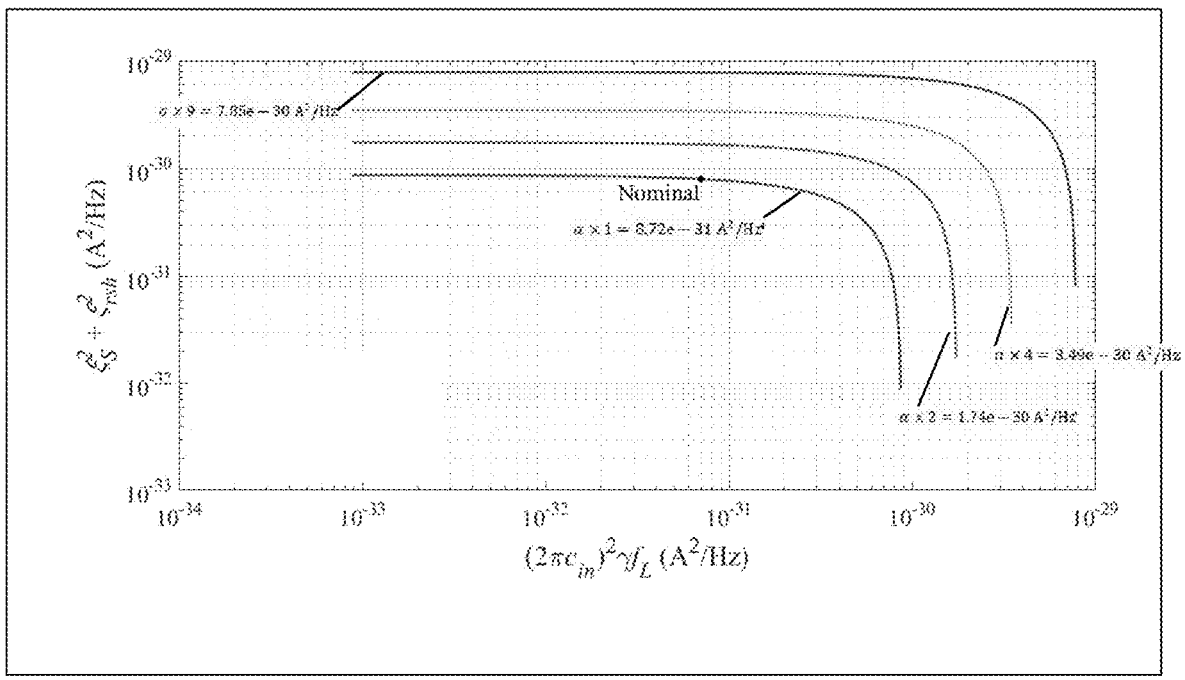
FIG. 7 is a plot of the components of the $α_d$ term. The black dot indicates the value of both components used in the amplifier used in one embodiment the present technology.

In FIG. 7 the 2 subcomponents of $\alpha_d$ are plotted for different values of $\alpha_d$. The plot illustrates that for the worst-case $\alpha_d$ (purple line $\alpha_d \times 9$), the sum of $\xi_S^2$ and $\xi_{rsh}^2$ must be less than 7.85×10⁻³⁰ A²/Hz in order to meet the noise performance limit of 50 fA_{RMS}.

$$\alpha_d \xi_S^2 + \xi_{rsh}^2 + (2\pi c_{in})^2 \gamma f_L \quad (11)$$

$$\xi_S^2 + \xi_{rsh}^2 = \alpha_d - (2\pi c_{in})^2 \gamma f_L \quad (12)$$

The sum of $\xi_S^2$ and $\xi_{rsh}^2$ can be redefined as:

$$\xi_\Sigma^2 = \xi_S^2 + \xi_{rsh}^2 \quad (13)$$

Substituting the above equation into equation (12) and using the worst-case value of $\alpha_d$ yields:

$$\xi_\Sigma^2 = \overline{\alpha_d} - (2\pi c_{in})^2 \gamma f_L \quad (14)$$

The above equation illustrates that neither $\xi_\Sigma^2$ or $(2\pi c_{in})^{2l} \gamma f_L$ may be larger than $\overline{\alpha_d}$. It can therefore be concluded that:

$\xi_\Sigma^2 \leq 8.33 \times 10^{-30}$ A²/Hz and $(2\pi c_{in})^2 \gamma f_L \leq 8.33 \times 10^{-30}$ A²/Hz and (14) is true.

FIG. 7 illustrates the asymptotic limits of the worst-case curve (purple). The term $\xi_{rsh}^2$ in equation (13) is defined as:

$$\xi_{rsh}^2 = \frac{4kT}{r_{sh}} \quad (15)$$

Substituting equation (15) into equation (13) and solving for $r_{sh}$ yields:

$$r_{sh} = \frac{4kT}{\xi_\Sigma^2 - \xi_S^2} \quad (16)$$

Figure 8:
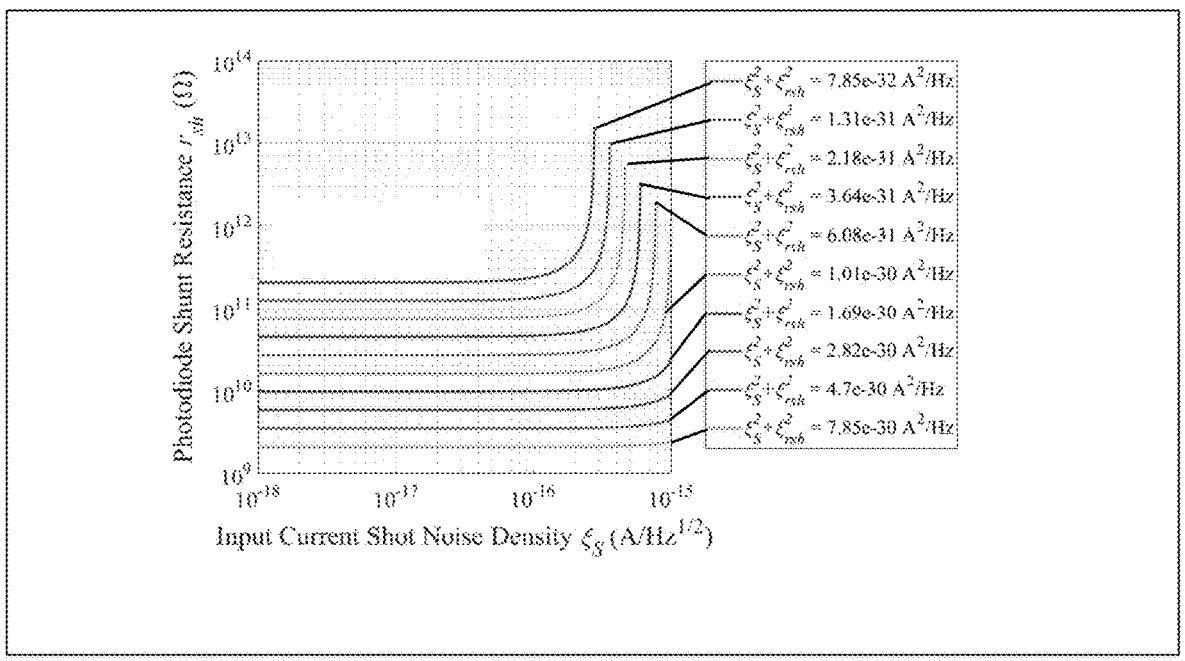
FIG. 8 is a graph illustrating combinations of $ξ_s$ and $r_{sh}$ that yield $i_n$≤50 $fA_{RMS}$. For this plot, the curve from FIG. 7 was used where $α_d'=α_d×9$. Each point on the purple curve in FIG. 7 is a curve on the plot in this figure.

-continued $$\overline{r_{sh}} = \frac{4kT}{\xi_\Sigma^2(\overline{\alpha_d})}$$

Where $\xi_\Sigma^2(\overline{\alpha_d})$ is $\xi_\Sigma^2$ for $\alpha_d = \overline{\alpha_d}$. Using the worst-case value of $\xi_\Sigma^2$=8.33×10⁻³⁰ A²/Hz, it is determined that $r_{sh} \geq 1.95$ GΩ, for $\xi_\Sigma^2 >> \xi_S^2$ and $\xi_S^2 < \xi_\Sigma^2$ or $\xi_S < 2.88$ fA/√Hz Considering the worst-case curve from FIG. 7 (shown in purple) where $\xi_\Sigma^2$ vs $(2\pi c_{in})^2 \gamma f_L$ is plotted for $\alpha_d \times 9$, data points from this curve can be taken and for each substituted into the above equation and sweep $\xi_S$, generating FIG. 8.

The term $(2\pi c_{in})^2 f_L \gamma$ is defined as shown below:

$$\xi_\gamma = (2\pi c_{in})^2 f_L \gamma \quad (17)$$

Rearranging the above equation to solve for yields $$\sigma_{in} = \frac{1}{2\pi}\sqrt{\frac{\xi_\gamma}{f_L \gamma}} \quad (18)$$

Figure 9:
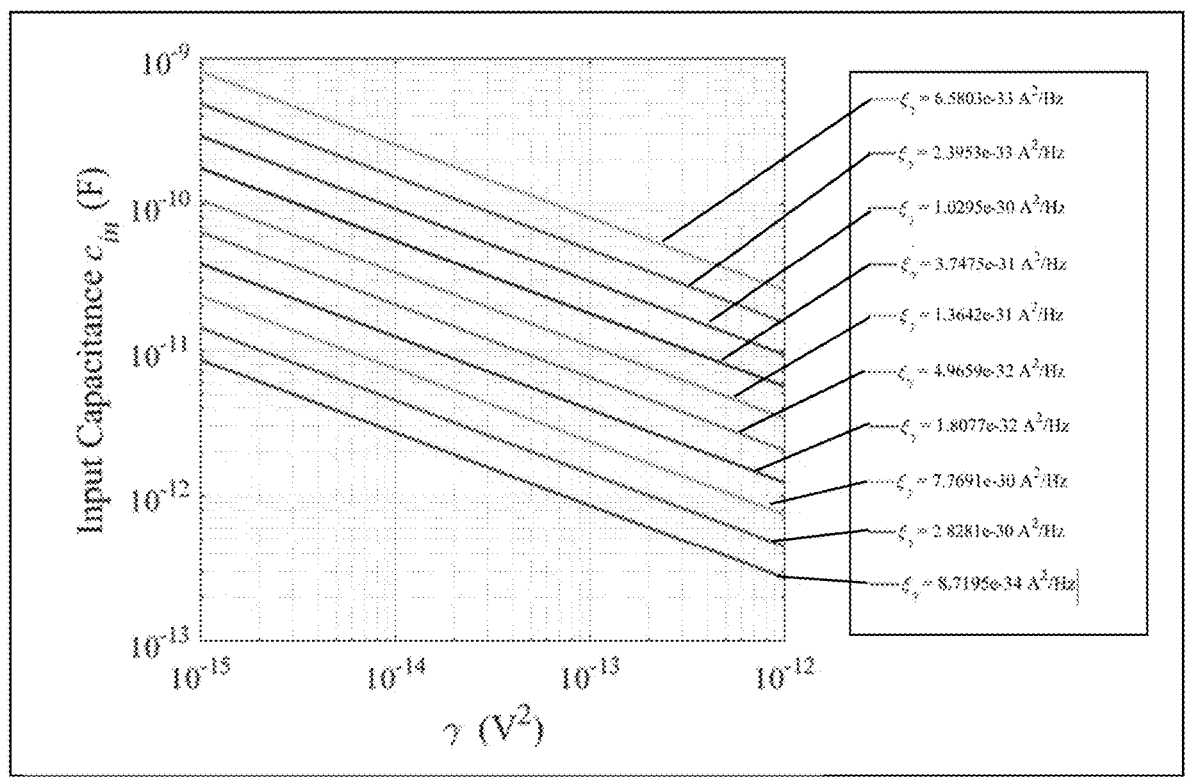
FIG. 9 is a graph illustrating Sweep of γ for discrete value of $ξ_γ$ taken from the worst-case curve in FIG. 7. Each curve in the plot comes from a different point on the curve in FIG. 7.

To generate FIG. 9, a sampling of values of $\xi_\gamma$ is used which were used to generate the plot in FIG. 7. The range of possible $\gamma$ values are swept and the corresponding $c_{in}$ is calculated using equation (18).

Rearranging equation (3) and solving for $\psi_T$ provides:

$$\psi_Y = \sqrt{\frac{\gamma - FNN^2 \ln\left(\frac{\pi^2}{4} + 1\right)}{\left(\frac{\pi}{2} - 1\right)f_L}} \quad (19)$$

Figure 10:
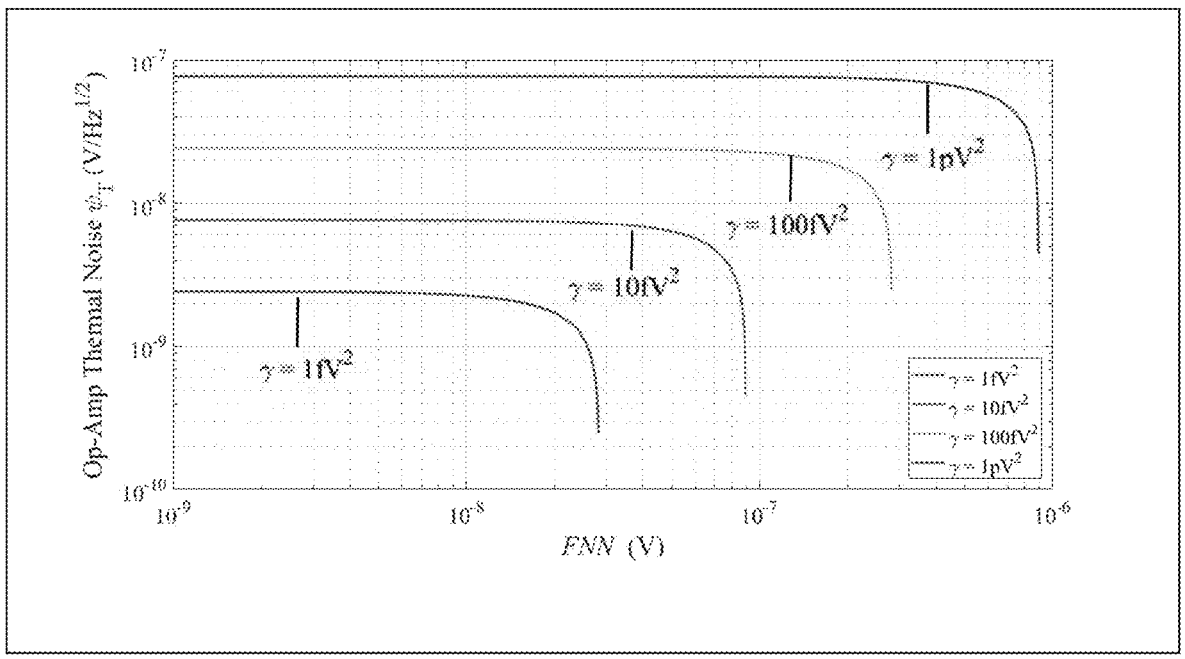
FIG. 10 is a graph illustrating flicker noise numerator (FNN) vs op-amp thermal noise $ψ_T$ for discrete values of γ.

In FIG. 10, equation 19 is plotted, sweeping the value of FNN for different values of $\gamma$.

Because it is difficult to determine exactly what the resulting bandwidth will be from the components chosen for the high-sensitivity photodetector with high-gain transimpedance amplifier (PD-TIA) of the present technology, an optional capacitive T-network is added for tuning the bandwidth with 2-32 fF of capacitance. In embodiments, the PD-TIA has a bandwidth of about 50 Hz, 100 Hz, 150 Hz, 200 Hz, 300 Hz, 400 Hz, 500 Hz, or 650 Hz.

In recognition that the performance stats and parameters given in the spec sheets for electronic components are often approximations, the term 'about' is used in the preceding to mean that the actual value is within a certain range of that specified, such as within about ±1%, ±2%, ±3%, ±5%, ±10%, ±15% or ±25% of the value specified.

Although preferred embodiments have been depicted and described in detail herein, it will be apparent to those skilled in the relevant art that various modifications, additions, substitutions, and the like can be made without departing from the spirit of the technology and these are therefore considered to be within the scope of the technology as defined in the claims which follow.

What is claimed is:
1. A device comprising:
a sensor having an anode and a cathode;
an operational amplifier having a single-ended output terminal, a non-inverting input, and an inverting input, the inverting input of the op-amp operatively coupled to one of the anode or the cathode of the sensor;

a feedback resistor having a resistance of at least approximately one giga-ohm (1 GΩ) operatively coupled between the single-ended output terminal and the inverting input of the op-amp; and a grounded field shunt positioned adjacent to the feedback resistor, wherein the op-amp, grounded field shunt, and feedback resistor are disposed within an electric shield enclosure, and wherein the single-ended output terminal of the op-amp terminates outside of the electrical shield enclosure.

2. The device of claim 1, wherein the sensor is one of a thermoelectric, piezoelectric, pyroelectric, electrochemical, or photovoltaic sensor.

3. The device of claim 1 further comprising a capacitive T-network located within the electrical shield enclosure in parallel with the feedback resistor.

4. The device of claim 1, wherein the sensor is a PIN photodiode.

5. The device of claim 1, wherein the sensor is at least partially disposed in a sensor electrical shield.

6. The device of claim 5, wherein the sensor electrical shield is configured to transfer stray capacitance to ground.

7. The device of claim 5, wherein the sensor electrical shield is located within the electrical shield enclosure.

8. The device of claim 1, wherein the non-inverting input of the op-amp is connected to ground, at least one of the anode or the cathode that is not connected to the inverting input of the op-amp is connected to ground, or the noninverting input of the op-amp and the at least one of the anode or the cathode that is not connected to the inverting input of the op-amp are connected to ground.

9. The device of claim 1, wherein the electrical shield enclosure comprises a roughly continuous layer of electrically conductive material.

10. The device of claim 1, further comprising a printed circuit board (PCB) comprising a nonconductive substrate, wherein the sensor, the op-amp, the grounded field shunt, and the feedback resistor, are disposed on the nonconductive substrate, wherein the electrical shield enclosure comprises a ground plane under the nonconductive substrate of the PCB and a conductive box connected to the ground plane by one or more conductive vias through or around the nonconductive substrate.

11. The device of claim 10, wherein the single-ended output terminal is routed between the conductive vias connecting the conductive box and the ground plane.

12. The device of claim 1, wherein the electrical shield enclosure is configured to transfer stray capacitance to ground.

13. The device of claim 1, wherein the capacitive T-network produces a capacitance less than or equal to about 50 femtofarads.

14. The device of claim 1, wherein the feedback resistor has an input end and an output end and a longitudinal axis between the input and output ends, and the grounded field shunt has an area which is roughly centered under the longitudinal axis of the feedback resistor and closer to the output terminal of the feedback resistor.

15. The device of claim 1, wherein the sensor has a shunt resistance ($r_{sh}$) that is greater than about 1 GΩ.

16. The device of claim 1, wherein the feedback resistor has a resistance ($R_F$) greater than about 10 GΩ.

17. The device of claim 1, wherein the op-amp has a current noise less than about 2 fA/√Hz and a voltage noise less than about 30 nV/√Hz.

18. The device of claim 1 having a bandwidth of about 300 Hz.

19. A method of measuring a feature of a signal, the method comprising:
providing the device of claim 1;
receiving, by the sensor, the signal to be measured;
outputting, at the single-ended output terminal of the op-amp, an amplified signal based on the received signal; and
measuring at least one feature of the signal based on the amplified signal.

20. The method of claim 19, wherein the signal is an optical signal.

21. The method of claim 20, wherein the at least one feature comprises a fluorescence signal from a cell.

* * * * *